United States Patent
Vancorenland et al.

(10) Patent No.: US 7,772,934 B2
(45) Date of Patent: Aug. 10, 2010

(54) CALIBRATION OF PHASE LOCKED LOOP PARAMETERS BASED ON STATIC BAND INFORMATION

(75) Inventors: Peter Vancorenland, Austin, TX (US); Ramkishore Ganti, Dripping Springs, TX (US); Russell Croman, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 693 days.

(21) Appl. No.: 11/227,298

(22) Filed: Sep. 14, 2005

(65) Prior Publication Data

US 2007/0060081 A1    Mar. 15, 2007

(51) Int. Cl.
*H03B 1/00* (2006.01)

(52) U.S. Cl. .............. 331/179; 331/167; 331/34; 331/117 R; 331/117 FE

(58) Field of Classification Search ............ 331/177 V, 331/167, 34, 117 R, 117 FE
See application file for complete search history.

(56) References Cited

U.S. PATENT DOCUMENTS

| | | | |
|---|---|---|---|
| 6,583,675 B2 * | 6/2003 | Gomez | 331/17 |
| 6,760,575 B2 | 7/2004 | Welland | 455/260 |
| 6,856,205 B1 * | 2/2005 | Groe et al. | 331/17 |
| 7,259,638 B2 * | 8/2007 | Takahashi | 331/179 |
| 2007/0057743 A1 | 3/2007 | Vancorenland et al. | 331/179 |

* cited by examiner

*Primary Examiner*—Arnold Kinkead
(74) *Attorney, Agent, or Firm*—Trop, Pruner & Hu, P.C.

(57) ABSTRACT

A technique includes selecting one out of a plurality of frequency bands and providing a voltage controlled oscillator to generate a mixing signal for the selected frequency band. The technique includes adjusting a frequency gain of the voltage controlled oscillator based on the selected frequency band.

13 Claims, 10 Drawing Sheets

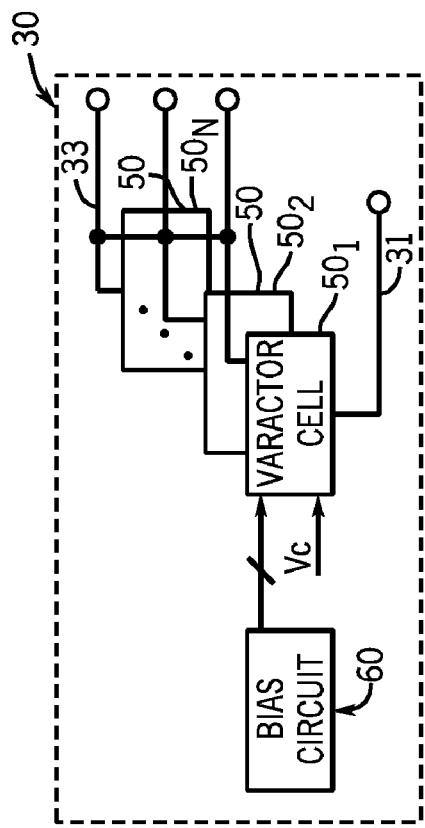
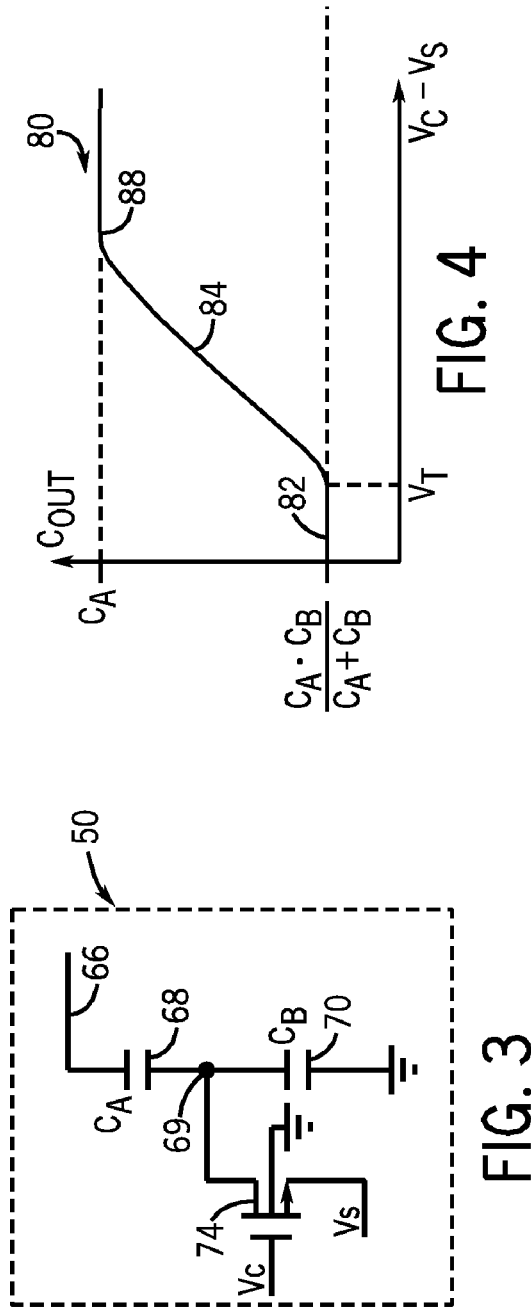
FIG. 2
FIG. 3
FIG. 4

US 7,772,934 B2

CALIBRATION OF PHASE LOCKED LOOP PARAMETERS BASED ON STATIC BAND INFORMATION

CROSS-REFERENCE TO RELATED APPLICATIONS

This application is related to U.S. patent application Ser. No. 11/227,421, entitled "ANALOG VARACTOR," now U.S. Pat. No. 7,394,329 filed concurrently herewith.

BACKGROUND

The invention generally relates to the calibration of phase locked loop parameters based on static band information.

A varactor is an electronic device whose capacitance is a function of a control voltage that is applied to the device. The varactor typically is used, for example, in an oscillator to control its oscillation frequency.

As a more specific example, the oscillator may be a voltage controlled oscillator (VCO) of a phase locked loop (PLL). The VCO typically generates an oscillating output signal for the PLL, and the PLL controls the oscillation frequency of the VCO to lock the output signal onto a reference signal. In this regard, the PLL typically regulates a frequency control signal that is provided to a varactor of the VCO in a feedback loop to achieve the lock. The frequency control signal is a function of the phase difference between the reference signal and the PLL's output signal. Thus, by controlling the capacitance of the varactor with the frequency control signal, the PLL finely tunes the oscillation frequency of the VCO to achieve the lock.

SUMMARY

In an embodiment of the invention, a technique includes selecting one out of a plurality of frequency bands and providing a voltage controlled oscillator to generate a mixing signal for the selected frequency band. The technique includes adjusting a frequency gain of the voltage controlled oscillator based on the selected frequency band.

In another embodiment of the invention, a phase locked loop includes a phase detector and an oscillator. The phase detector generates a frequency control signal in response to a comparison between an indication of a reference signal and an indication of an output signal. The oscillator generates the output signal in response to the frequency control signal. The oscillator is adapted to adjust a frequency gain of the oscillator based on a selected frequency band for the output signal.

In yet another embodiment of the invention, a wireless system includes a tuner and a local oscillator circuit. The tuner receives a mixing signal to tune within a selected frequency band and the local oscillator generates the mixing signal. The local oscillator circuit generates the mixing signal, and the local oscillator circuit includes an oscillator to generate the mixing signal in response to a frequency control signal. The frequency gain of the oscillator is compensated based on the selected frequency band.

Advantages and other features of the invention will become apparent from the following drawing, description and claims.

BRIEF DESCRIPTION OF THE DRAWING

FIG. 2 is a schematic diagram of a variable capacitor of a voltage control oscillator of the phase locked loop of FIG. 1 according to an embodiment of the invention.

FIG. 3 is a schematic diagram of a single-ended varactor cell of FIG. 2 according to an embodiment of the invention.

FIG. 4 is a transfer function illustrating a capacitance of the varactor cell versus a voltage that is provided to the varactor cell according to an embodiment of the invention.

DETAILED DESCRIPTION

Figure 1:
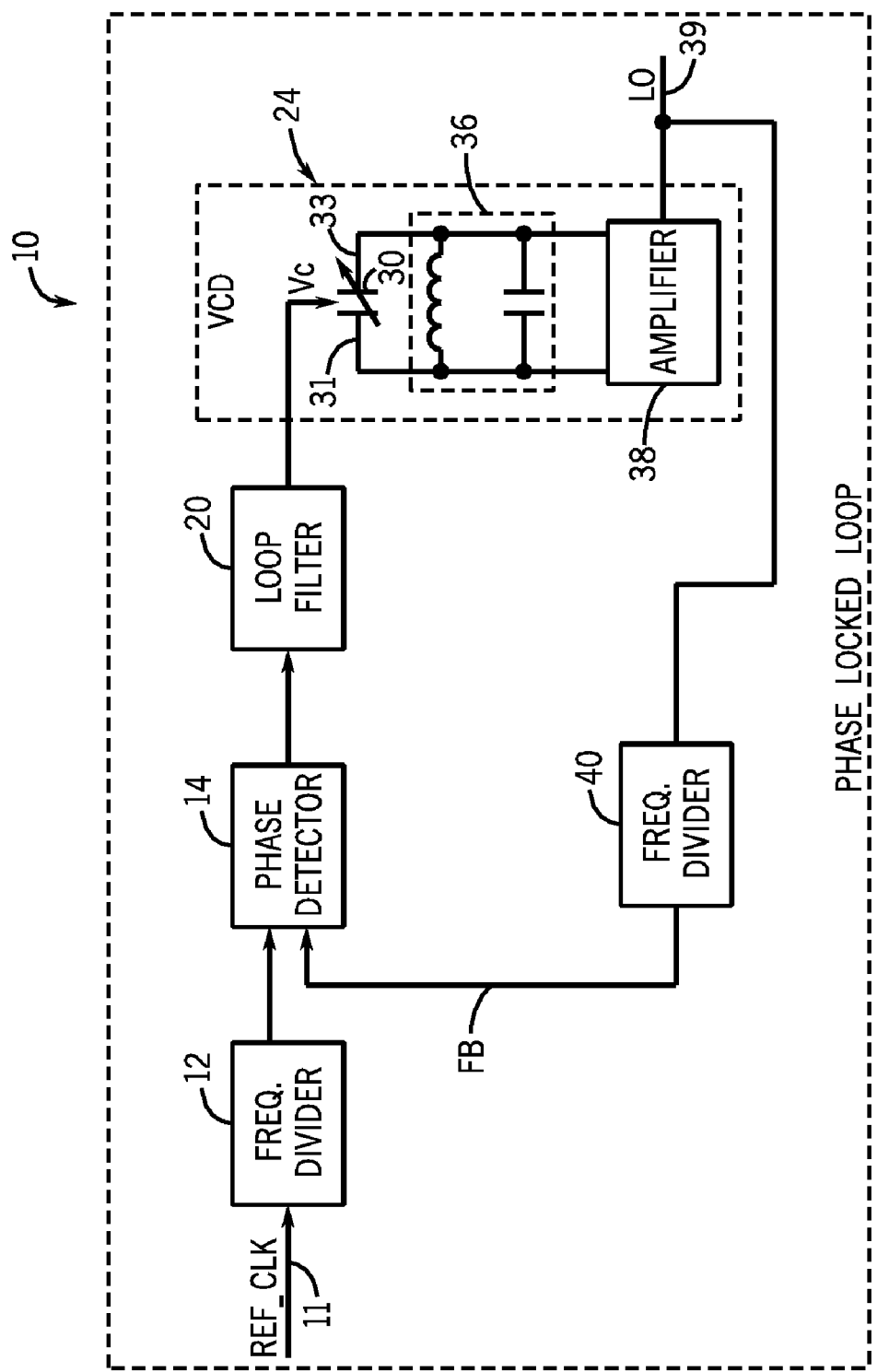
FIG. 1 is a schematic diagram of a phase locked loop according to an embodiment of the invention.

Referring to FIG. 1, in accordance with embodiments of the invention, analog varactor cells are electrically coupled together to form a variable capacitor 30. As described below, the capacitance of the variable capacitor 30 may be controlled in a linear fashion using an analog frequency control signal (called "$V_C$" in FIG. 1) over a relatively large range of the signal, as compared to conventional capacitive devices. Although FIG. 1 depicts the variable capacitor 30 as being part of a voltage controlled oscillator (VCO) 24 of a phase locked loop (PLL) 10, it is understood that other circuits and systems other than PLLs and systems that include PLLs may use the varactor-based variable capacitor 30 in accordance with the many possible embodiments of the invention.

Referring now to an exemplary application of the variable capacitor 30, the VCO 24 generates an oscillating signal (called "LO" in FIG. 1) at an output terminal 39 of the PLL 10. The VCO 24 responds to the $V_C$ frequency control signal, which as its name implies, controls the frequency of the VCO 24 for purposes of locking the PLL 10 onto a reference clock signal (called "REF_CLK" in FIG. 1). As shown in FIG. 1, the PLL 10 may include a phase detector 14 that compares a feedback signal (called "FB" in FIG. 1) to a clock signal (called "CLK" in FIG. 1) which is derived from the REF_CLK reference clock signal for purposes of generating a signal at the output terminal (of the phase detector 14) that indicates the phase relationship between the FB and CLK signals.

The phase detector 14 may include a charge pump (not shown) to generate this signal in response to the phase comparison. The signal from the phase detector 14, in turn, passes through a loop filter 20 of the PLL 10 to generate the $V_C$ frequency control signal. As depicted in FIG. 1, the FB feedback signal may be, in some embodiments of the invention, reduced in frequency from the LO signal via a frequency divider 40; and the CLK reference clock signal may have a different frequency from the REF_CLK reference clock signal due to a frequency divider 12.

For purposes of locking the LO signal onto the REF_CLK reference clock signal, the $V_C$ frequency control signal adjusts a capacitance of the VCO 24. More particularly, in some embodiments of the invention, the VCO 24 may be formed, for example, from an amplifier 38 that is coupled to a resonant tank 36 (an LC tank, for example, as shown). The resonant tank 36 coarsely establishes the frequency of the LO signal, with the fine tuning of the frequency of the LO signal being accomplished through the use of the variable capacitor 30, which is coupled (via its output terminals 31 and 33) to the resonant tank 36. Thus, the PLL 10 adjusts the frequency of the variable capacitor 30 for purposes of fine tuning the VCO 24 to lock the LO signal onto the REF_CLK reference clock signal.

It is noted that the VCO 24 may be another type of oscillator (a ring oscillator, for example), in other embodiments of the invention. Furthermore, the varactor-based variable capacitor may be used in an oscillator other than a controlled oscillator in other embodiments of the invention, as well be used in a circuit other than an oscillator in yet other embodiments of the invention.

Referring to FIG. 2, the variable capacitor 30 is formed from N varactor cells 50 (varactor cells $50_1$, $50_2$ ... $50_N$, depicted as examples in FIG. 2) that are coupled together (in parallel, for example) to form an effective overall capacitance between the output terminals 31 and 33 of the variable capacitor 30. Each varactor cell 50 receives the $V_C$ frequency control signal and a bias voltage from a bias circuit 60.

Referring to FIG. 3, in accordance with some embodiments of the invention, the varactor cell 50 may be a "single-ended" cell, which is formed from two capacitors 68 (having a capacitance called "$C_A$" in FIG. 3) and 70 (having a capacitance called "$C_B$" in FIG. 3) and a switch, such as a switch that is formed from an n-channel metal-oxide-semiconductor field effect transistor (NMOSFET) 74. More specifically, the capacitor 68 is coupled between the output terminal 33 and a node 69, and the capacitor 70 is coupled between the node 69 and ground (which serves as the output terminal 31 for the single-ended cell 50).

The drain terminal of the NMOSFET 74 is coupled to the node 69, the source terminal of the NMOSFET 74 receives a bias voltage (called "$V_S$" in FIG. 3 from the bias circuit 60), the gate terminal of the NMOSFET 74 receives the $V_C$ frequency control signal and the substrate terminal of the NMOSFET 74 is coupled to ground. Referring to FIG. 3 in conjunction with FIG. 4, if the NMOSFET 74 were an ideal switch, the capacitance that is exhibited at the output terminal 33 of the varactor cell 50 would either be the $C_A$ capacitance (when the switch is closed to short out the capacitor 70) or the capacitance formed from the series combination of the capacitors 68 and 70 (when the switch is open). However, because the NMOSFET 74 is not an ideal switch, the capacitance that is exhibited by the varactor cell 50 generally falls into one of three regions: a low capacitance region 82 (see FIG. 4), which is the capacitance formed from the series combination of the capacitors 68 and 70 when the NMOSFET 74 is completely turned off; a high capacitance region 88 in which the varactor cell 50 exhibits the $C_A$ capacitance when the NMOSFET 74 is fully turned on and saturated; and a general linear, transition region 84 that extends between the two regions 82 and 88 and represents the capacitance that is exhibited by the varactor cell 50 between the off and saturated states of the NMOSFET 74.

Thus, as depicted in FIG. 4, in response to the gate-to-source voltage (represented by the difference of the $V_C$ and $V_S$ signals) of the NMOSFET 74 transitioning past its threshold voltage (called "$V_T$" in FIG. 4), the varactor cell 50 transitions from the low capacitance region 82 into the transition region 84. As the gate-to-source voltage of the NMOSFET 74 increases, the NMOSFET 74 eventually saturates to cause the varactor cell 50 transition from the transition region 84 into the high capacitance region 88. During normal operation of the PLL 10, each varactor cell 50 operates in the transition region 84 to control the frequency of the VCO 24.

Figure 5A:
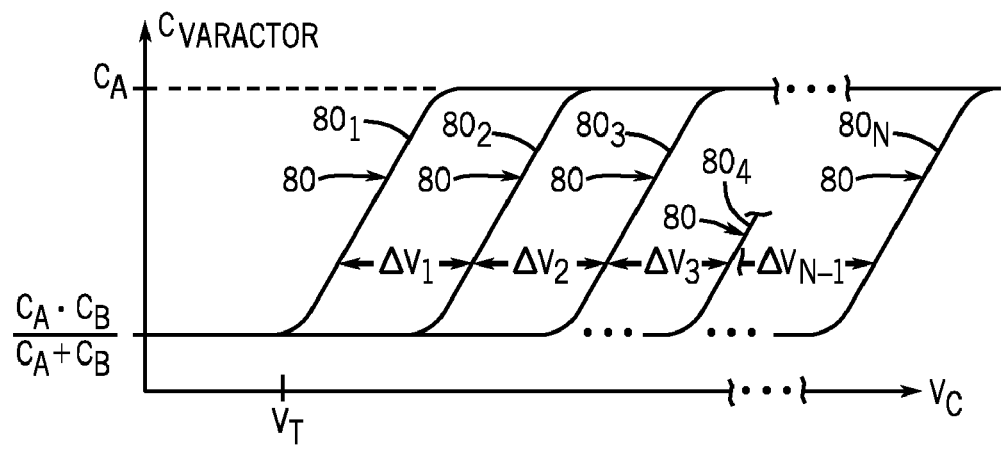
FIG. 5A illustrates offsetting of the varactor capacitance versus control voltage curves according to an embodiment of the invention.
Figure 5B:
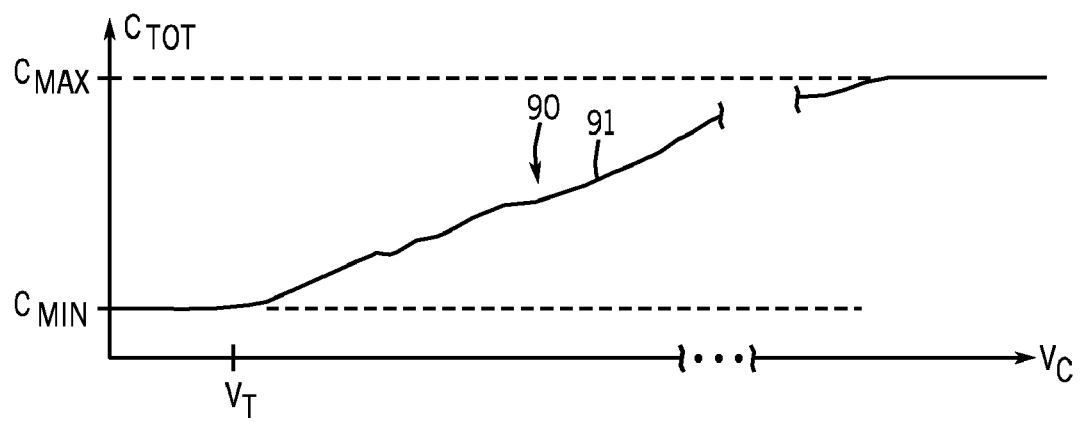
FIG. 5B is a transfer function illustrating a capacitance versus control voltage curve for the variable capacitor of FIG. 1 according to an embodiment of the invention.

Referring to FIG. 5A in conjunction with FIG. 3, the bias voltages that are provided to the source terminals are offset to offset capacitance versus $V_C$ frequency control signal transfer functions of the varactor cells 50. Because the varactor cells 50 are coupled together in parallel, in some embodiments of the invention, the offsetting of the bias voltages effectively expands a linear control range 91 for the variable capacitor 30, as depicted in a transfer function 90 of the variable capacitor's capacitance (called "$C_{OUT}$") versus the $V_C$ frequency control signal in FIG. 5B. Thus, as an example, the bias voltages that are applied to the source terminals of the varactor cells 50 are offset from each other by the depicted voltage offsets ($\Delta V_1$, $\Delta V_2$, $\Delta V_3$, ... $\Delta V_{N-1}$) so that N varactor capacitance versus $V_C$ frequency control signal transfer functions 80 (transfer functions $80_1$, $80_2$, $80_3$, $80_4$ ... $80_N$, depicted in FIG. 5 as examples) are combined to produce the transfer function 90 that is shown in FIG. 5B.

It is assumed herein that the transfer functions 80 are offset via a uniform offset voltage called "$\Delta V$." Thus, it is assumed that the same $\Delta V$ offset voltage separates each pair of adjacent transfer functions 80, such as the transfer functions $80_2$ and $80_3$, for example.

Figure 6:
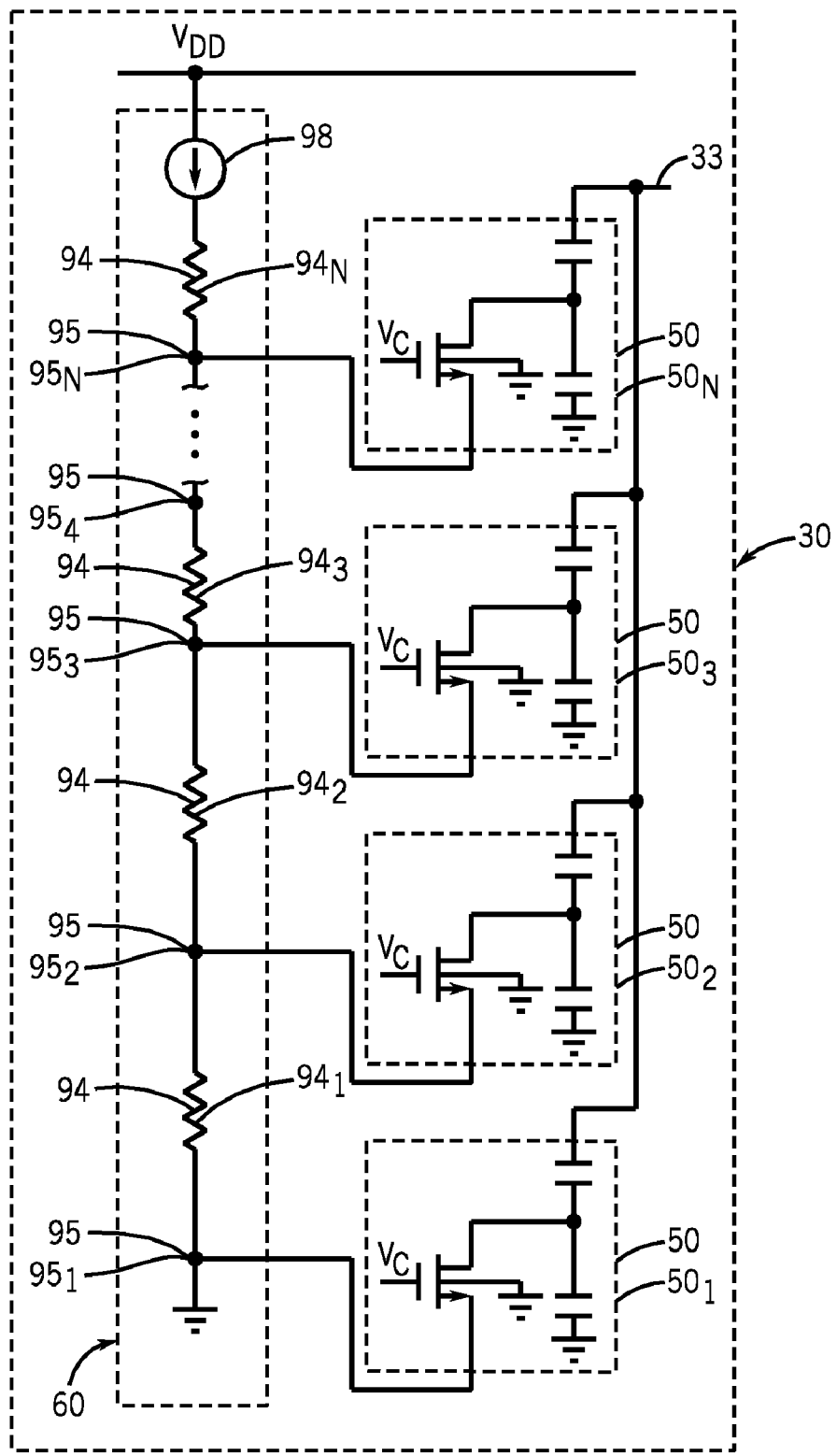
FIG. 6 is a more detailed schematic diagram of the variable capacitor of FIG. 2 according to an embodiment of the invention.

Referring to FIG. 6, in accordance with some embodiments of the invention, the bias circuit 60 may be formed from a resistor ladder that is coupled to receive current from a current source 98. More specifically, as depicted in FIG. 6, in accordance with some embodiments of the invention, the resistor ladder may be formed from resistors 94 (resistors $94_1$, $94_2$, $94_3$, ... $94_N$, being depicted as examples) that are effectively coupled in series to receive current from the current source 98, which is coupled to, for example, a $V_{DD}$ supply voltage. Nodes 95 (nodes $95_1$, $95_2$, $95_3$, ... $95_N$, being depicted as examples) that are provided at terminals of the resistors 94 provide a different bias voltage to each NMOSFET source terminal of the varactor cells 50. Thus, the node $95_1$ (which is ground for this example) provides the bias voltage to the source terminal of the varactor cell $50_1$, the node $95_3$ provides the bias voltage to the source terminal of the varactor cell $50_3$, etc.

If not for the bulk effect (described below) that affects the threshold voltages of the NMOSFETs 74, equal resistances for the resistors 94 produce the same voltage between each pair of adjacent nodes 95 and produce a uniform $\Delta V$ offset voltage to separate the transfer functions 80 (see FIG. 5A). However, due to the bulk effect, equal resistances for the resistors 94 do not produce a uniform $\Delta V$ offset.

More specifically, in general, the substrate terminal of each NMOSFET 74 (see FIG. 3) of the varactor cells 50₂-50ₙ is not connected to its source terminal, in some embodiments of the invention; but rather, each source terminal receives a bias voltage from the bias circuit 60, and each substrate terminal is coupled to ground. Therefore, depending on their position relative to the resistor ladder, some of the NMOSFETs 74 experience a greater bulk effect than the other NMOSFETs 74. More particularly, the farther a particular source terminal is from ground, the more bulk effect (and thus, a higher $V_T$ threshold voltage) is experienced by the associated NMOSFET 74. The bulk effect is essentially an increase in the $V_T$ threshold voltage due to the source terminal having a higher voltage than the substrate terminal. Therefore, for example, the NMOSFET 74 of the varactor cell 50ₙ experiences a more pronounced bulk effect and thus, has a higher $V_T$ threshold voltage than the NMOSFET 74 of the varactor cell 50₂.

Due to the bulk effect, the NMOSFETs 74 have different $V_T$ threshold voltages, which mean, if uncompensated, a uniform $\Delta V$ offset does not exist between the waveforms 60.

Therefore, in accordance with some embodiments of the invention, the resistances of the resistors 94 are appropriately varied, or "pre-warped," to compensate for the bulk effect. More specifically, the resistance of each resistor 94 is selected to compensate for the bulk effect based on the position of the resistor 94 in the resistor ladder, to make the $\Delta V$ uniform. Therefore, the resistors 94 have increasing resistances from ground toward the current source 68.

Figure 7:
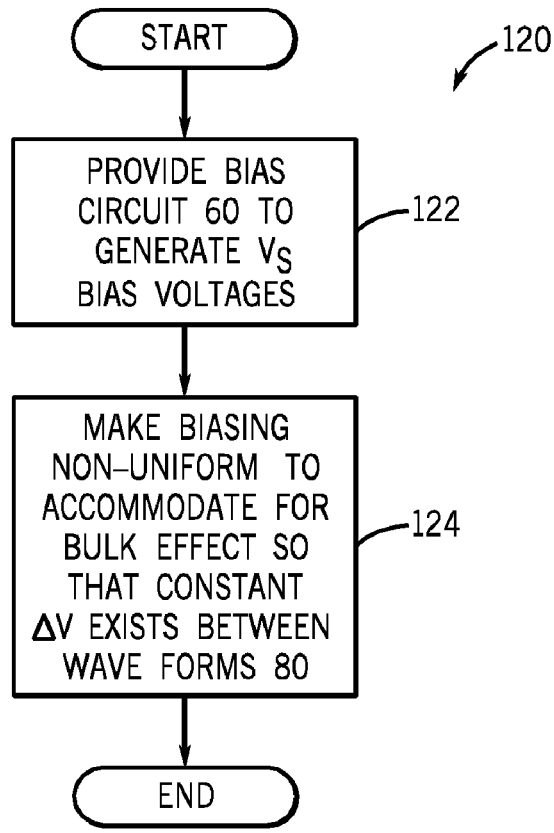
FIG. 7 is a flow diagram depicting a technique to compensate for a bulk effect according to an embodiment of the invention.

Thus referring to FIG. 7, in accordance with some embodiments of the invention, a technique 120 includes providing a bias circuit to generate bias voltages to the source terminals of the varactor cells 50, as depicted in block 122. Next, pursuant to the technique 120, the biasing is made non-uniform to accommodate for the bulk effect so that the capacitance versus $V_C$ control frequency transfer functions 80 (see FIG. 5A) are separated by a uniform bias offset $\Delta V$, as indicated in block 124.

It is noted that in other embodiments of the invention, the substrate terminals of the NMOSFETs 74 are not all connected to ground. For example, in other embodiments of the invention, each of the NMOSFETs 74 has its substrate and source terminals coupled together. For these embodiments of the invention, pre-warping of the resistances of the resistors 94 is unnecessary.

Figure 8:
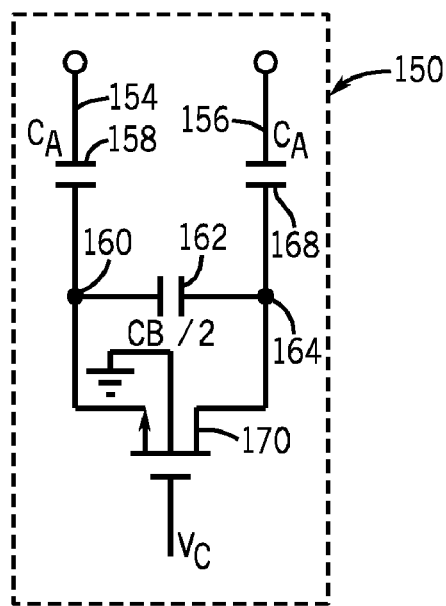
FIG. 8 is a schematic diagram of a differential varactor cell according to another embodiment of the invention.

Referring to FIG. 8, in accordance with some embodiments of the invention, the single-ended varactor cell 50 may be replaced by a differential varactor cell 150. Unlike the single-ended varactor cell 50, the differential varactor cell 150 includes two output terminals 154 and 156, and the capacitance of the varactor 150 appears at the output terminals 154 and 156. In accordance with some embodiments of the invention, the varactor cell 150 may include, for example, an NMOSFET 170 that has a gate terminal that receives the $V_C$ frequency control signal. A capacitor 162 (having a capacitance called "$C_{B/2}$" in FIG. 8) is coupled between the source and drain terminals of the NMOSFET 170. A capacitor 158 (having a capacitance called "$C_A$" in FIG. 8) is coupled between the source terminal and the output terminal 154; and a capacitor 168 (also having a capacitance called "$C_A$" in FIG. 8) is coupled between the drain terminal of the NMOSFET 170 and the output terminal 156.

Figure 9:
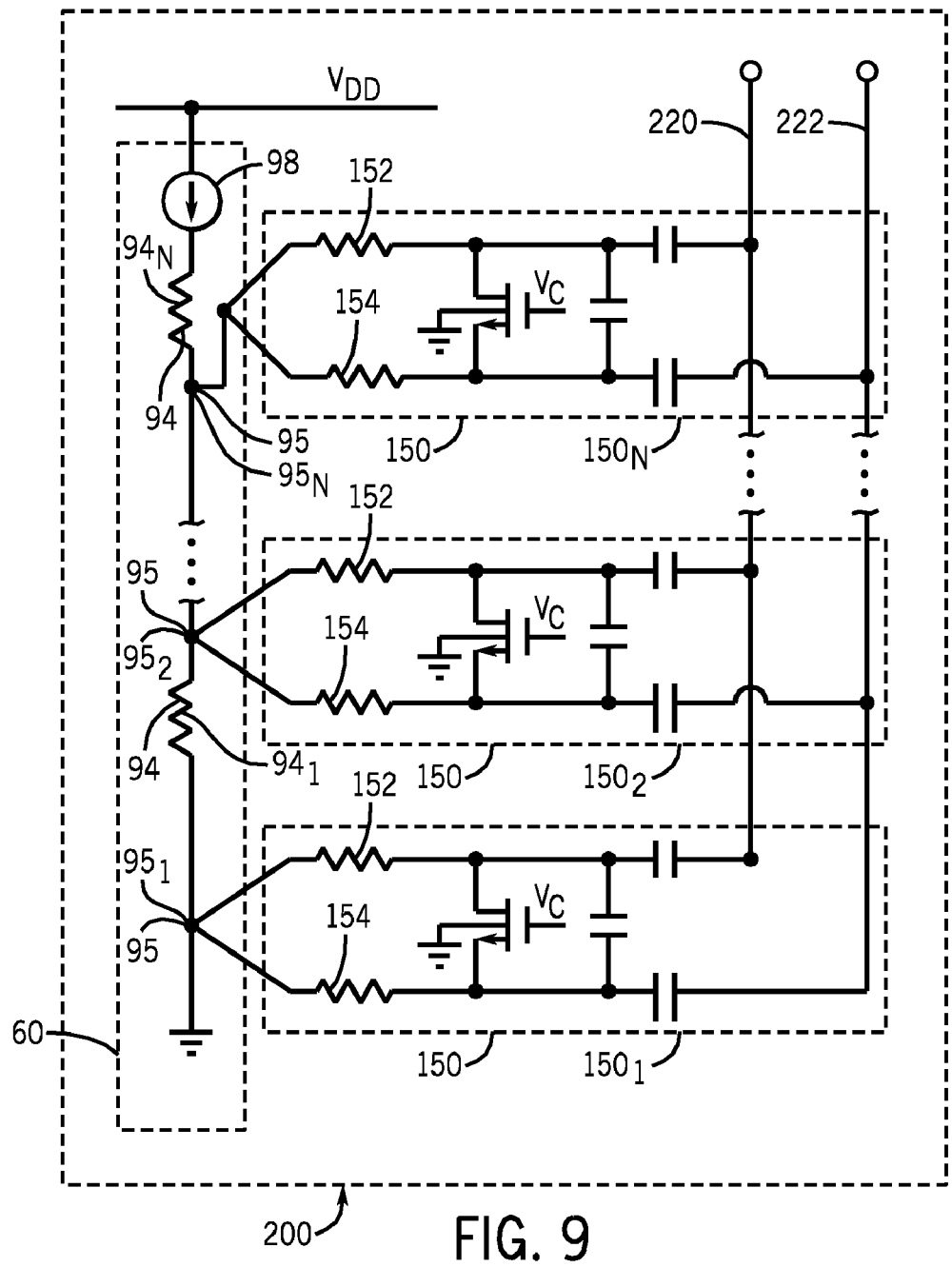
FIG. 9 is a schematic diagram of a variable capacitor that uses differential varactor cells of FIG. 1 according to another embodiment of the invention.

FIG. 9 depicts a specific application of the differential varactor cell 150, an application in which multiple varactor cells 150 are coupled together in parallel to form a variable capacitor 200. The variable capacitor 200 may be used in place of the variable capacitor 30 (see FIG. 1) in accordance with some embodiments of the invention.

As shown in FIG. 9, the variable capacitor 200 may use the same bias circuit 60 in that the nodes 95 of the bias circuit 60 are used to bias the varactor cells 150 (varactor cells 150₁, 150₂ . . . 150ₙ, being depicted in FIG. 9 as examples). For purposes of biasing the varactor cells 150, each varactor cell 150 is connected to a particular node 95 via a pair of coupling resistors 152 and 154. For example, for the node 95₁ (which is at ground of the bias circuit 60), a resistor 152 is coupled between the source of the NMOSFET 170 and the node 95₁; and a resistor 154 is coupled between the node 95₁ and the drain terminal of the NMOSFET 170.

In accordance with some embodiments of the invention, the resistors 94 of the bias circuit 60 may have the same values, with the resistances of the resistors 152 and 154 being selected to compensate for the bulk effects associated with the NMOSFETs 170 to make $\Delta V$ uniform. In other embodiments of the invention, the resistances of the resistors 94 may be adjusted to compensate for the bulk effect; and in yet other embodiments of the invention, both the resistances of the resistors 94 and the resistances of the resistors 152 may be sized to accommodate for the bulk effect.

Figure 10:
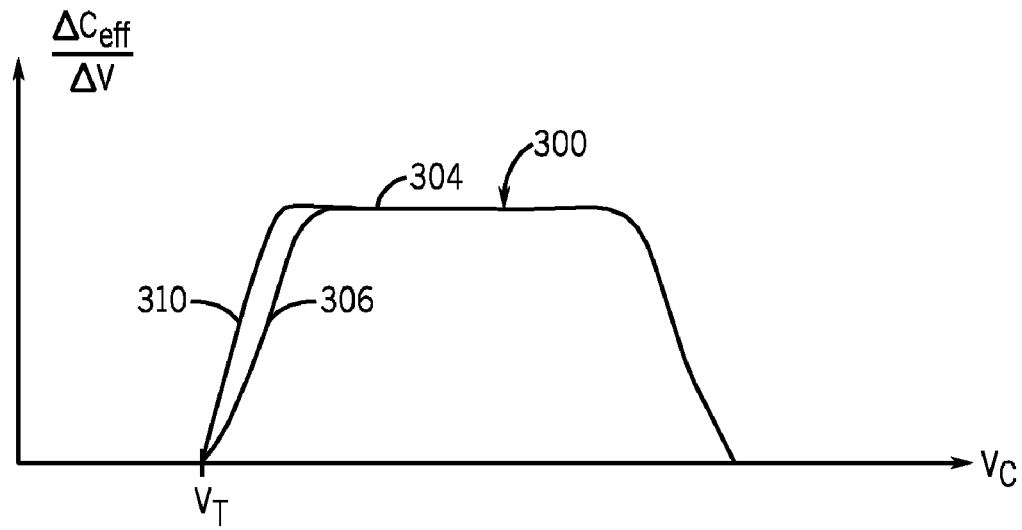
FIG. 10 illustrates an incremental capacitance to incremental bias voltage ratio versus a control voltage of the variable capacitor according to an embodiment of the invention.

Referring to FIG. 10, in accordance with some embodiments of the invention, a ratio of the incremental change in capacitance (called "Ceff") of the variable capacitor 30, 200, to $\Delta V$ may be represented by a curve 300. As shown, the curve 300 generally rises after the $V_C$ frequency control voltage passes the $V_T$ voltage threshold, as indicated by a positive slope 306 in the waveform 300. However, in accordance with some embodiments of the invention, the range of the frequency control may be extended at the lower end.

For example, in accordance with some embodiments of the invention, the resistances of the resistors 94 of the bias circuit 60 may be sized to place more weight on some of the transfer functions 80 (see FIG. 5A) closer to the $V_T$ threshold voltage. In this regard, instead of being set apart by a uniform $\Delta V$, $\Delta V$ may be smaller to more closely group the transfer functions 80 at the lower end of the $V_C$ frequency control signal than at the higher end of the range to boost the Ceff/$\Delta V$ ratio near the $V_T$ threshold, as indicated by the corresponding adjusted slope 310.

Figure 11:
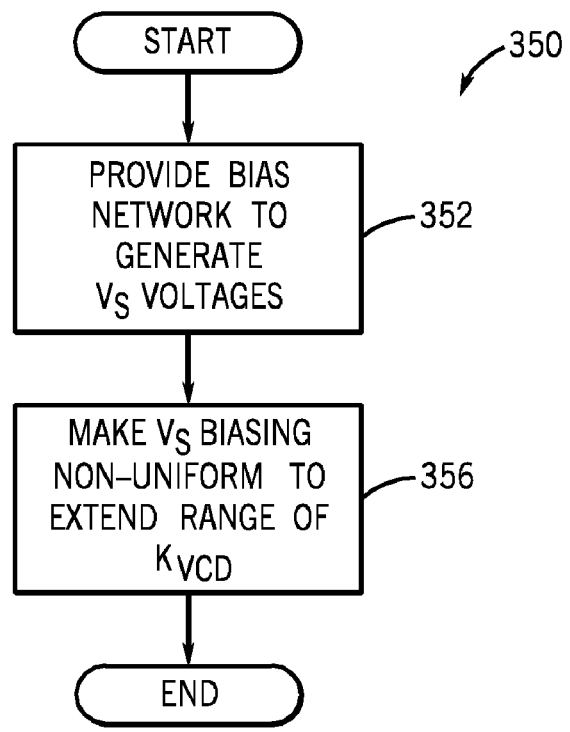
FIG. 11 is a flow diagram depicting a technique to extend the controllable range of the frequency gain of the variable capacitor according to an embodiment of the invention.

Referring to FIG. 11, therefore, in accordance with some embodiments of the invention, a technique 350 includes providing (block 352) a bias circuit to generate bias voltages for the source terminals of the varactor cells, and the technique includes making the biasing non-uniform to extend the frequency gain of the oscillator, as depicted in block 356.

Figure 12:
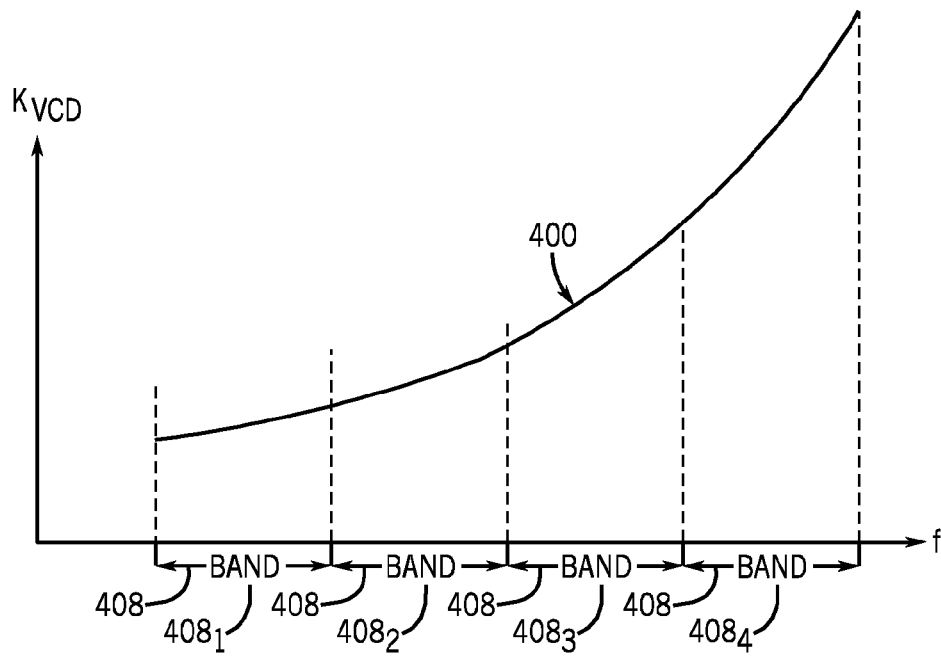
FIG. 12 illustrates a frequency gain of a voltage controlled oscillator of the prior art.

The $\Delta V$ offset may be regulated as a function of the frequency band to which the PLL 10 is generally tuned for purposes of improving the noise performance and/or loop stability of the PLL 10. More specifically, FIG. 12 depicts a waveform 400 that shows a frequency gain (called "$K_{VCO}$") of a VCO of a conventional PLL. As shown, the $K_{VCO}$ of the oscillator generally increases with frequency. More specifically, the $K_{VCO}$ frequency gain of the VCO varies with the cube of frequency, as described below:

$$K_{VCO} = -\frac{1}{2} \cdot (2\pi)^2 \cdot L \cdot f^3 \cdot \frac{\partial C}{\partial V}, \qquad \text{Equation 1}$$

where "f" is the oscillation frequency of the VCO, and "$\partial C/\partial V$" represents the incremental change in capacitance of the VCO with respect to an incremental change in the frequency control voltage.

Thus, due to the relationship that is described above in Equation 1, in general, the $K_{VCO}$ frequency gain rises as a power of three with the frequency. The PLL may be used in, for example, a cellular telephone that is capable of operating in one of a plurality of different bands 408: an ad-hoc Global System for Mobile Communications (AGSM) band $408_1$, an extended GSM (EGSM) band $408_2$, a digital cellular (DCS) band $408_3$ and a personal communications services (PCS) band $408_4$, as just a few examples. It is noted that for these bands, the band $408_3$ may overlap with the band $408_2$. Furthermore, the specific bands are listed merely for purposes of example, as other bands may be used in other embodiments of the invention.

Depending on a particular band 408 that is selected, the $K_{VCO}$ frequency gain may be relatively high. A challenge with such a technique is that higher frequency bands produces relatively larger noise, as the degree of noise also varies with the cube of the frequency.

Figure 13:
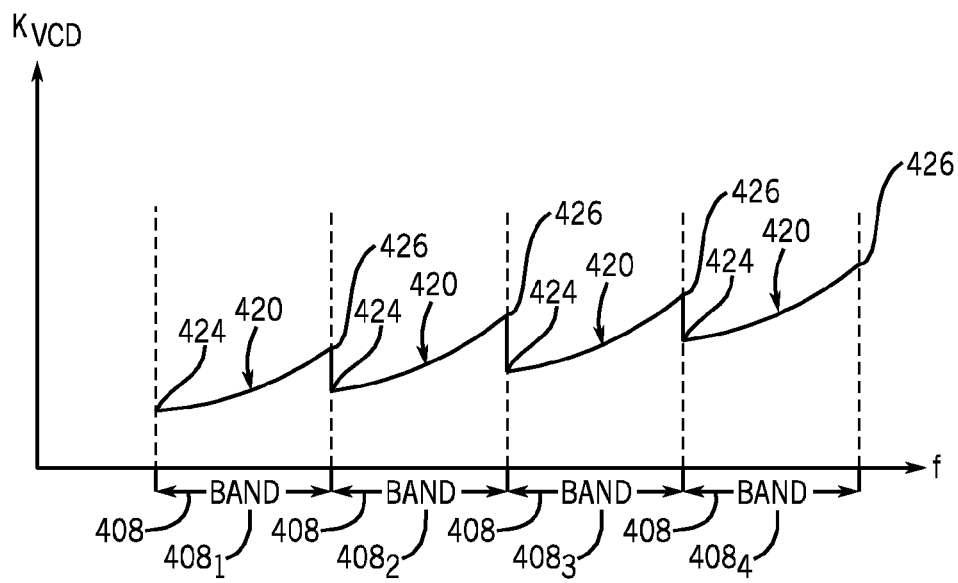
FIG. 13 illustrates a frequency gain of the oscillator of FIG. 1 according to an embodiment of the invention.

Therefore, in accordance with some embodiments of invention, the PLL 10 resets the $K_{VCO}$ frequency gain to fall within approximately the same gain range, regardless of the selected band. More specifically, as shown in FIG. 13, for any particular band 408, the $K_{VCO}$ frequency gain has a corresponding range 420 that from a low point 424 to a high point 426 pursuant to the above-described cubic relationship to the frequency. Thus, the $K_{VCO}$ frequency gain does not vary with the cube of the frequency between bands 408.

The change in the frequency range (called "$\Delta f_{RANGE}$") to the change in the $\Delta V$ offset may be described as follows:

$$\frac{\Delta f_{RANGE}}{\Delta V} = \frac{1}{2} \cdot (2\pi)^2 \cdot L \cdot f_{BAND,LOW}^3 \cdot \left(\frac{\partial C}{\partial V}\right)_{BAND}, \quad \text{Equation 2}$$

wherein "$f^3_{BAND,LOW}$" represents the low point of the frequency range and "$(\partial C/\partial V)_{BAND}$" represents a relatively constant amount indicating the change of capacitance per change in control voltage for each band. The selection of a higher frequency band corresponds to a higher $K_{VCO}$ as described in Equations 1 and 2, but pursuant to the technique disclosed herein, a higher dV is selected such that the $K_{VCO}$ becomes lower than it would otherwise be, as depicted in FIG. 12. Therefore, the current source 98 (of the bias circuit 60) may be adjusted to adjust the $\Delta V$ offsets accordingly to keep the $K_{VCO}$ frequency gain range generally the same for all bands 408.

To accommodate the adjustment of the $K_{VCO}$ frequency gain based on the band selected, in accordance with some embodiments of the invention, another gain in the PLL 10 is inversely varied with respect to the $K_{VCO}$ frequency gain. In this regard, in accordance with some embodiments of the invention, the gain of the phase detector 14 (see FIG. 1) is increased when the $K_{VCO}$ frequency gain is lowered (and vice versa) so that the product of the $K_{VCO}$ frequency gain and the gain of the phase detector is kept constant. For example, the bias current to the charge pump of the phase detector 14 may be controlled to set the appropriate gain of the phase detector 14.

Figure 14:
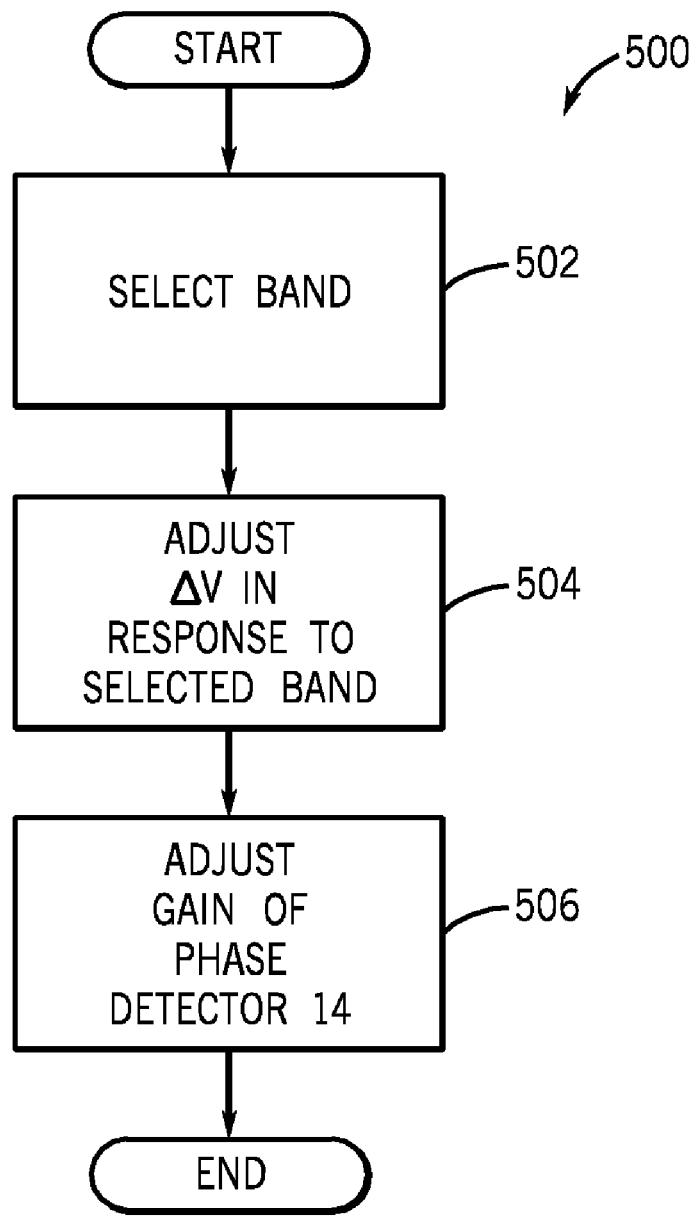
FIG. 14 is a flow diagram depicting a technique to control the frequency gain of the oscillator according to an embodiment of the invention.

Referring to FIG. 14 thus, in accordance with some embodiments of the invention, a technique 500 includes selecting (block 502) a particular frequency band and adjusting (block 504) the $\Delta V$ bias offset in response to the selected band. The technique 500 also includes adjusting (block 506) a gain of the phase detector 14 to maintain a favorable loop gain.

Figure 15:
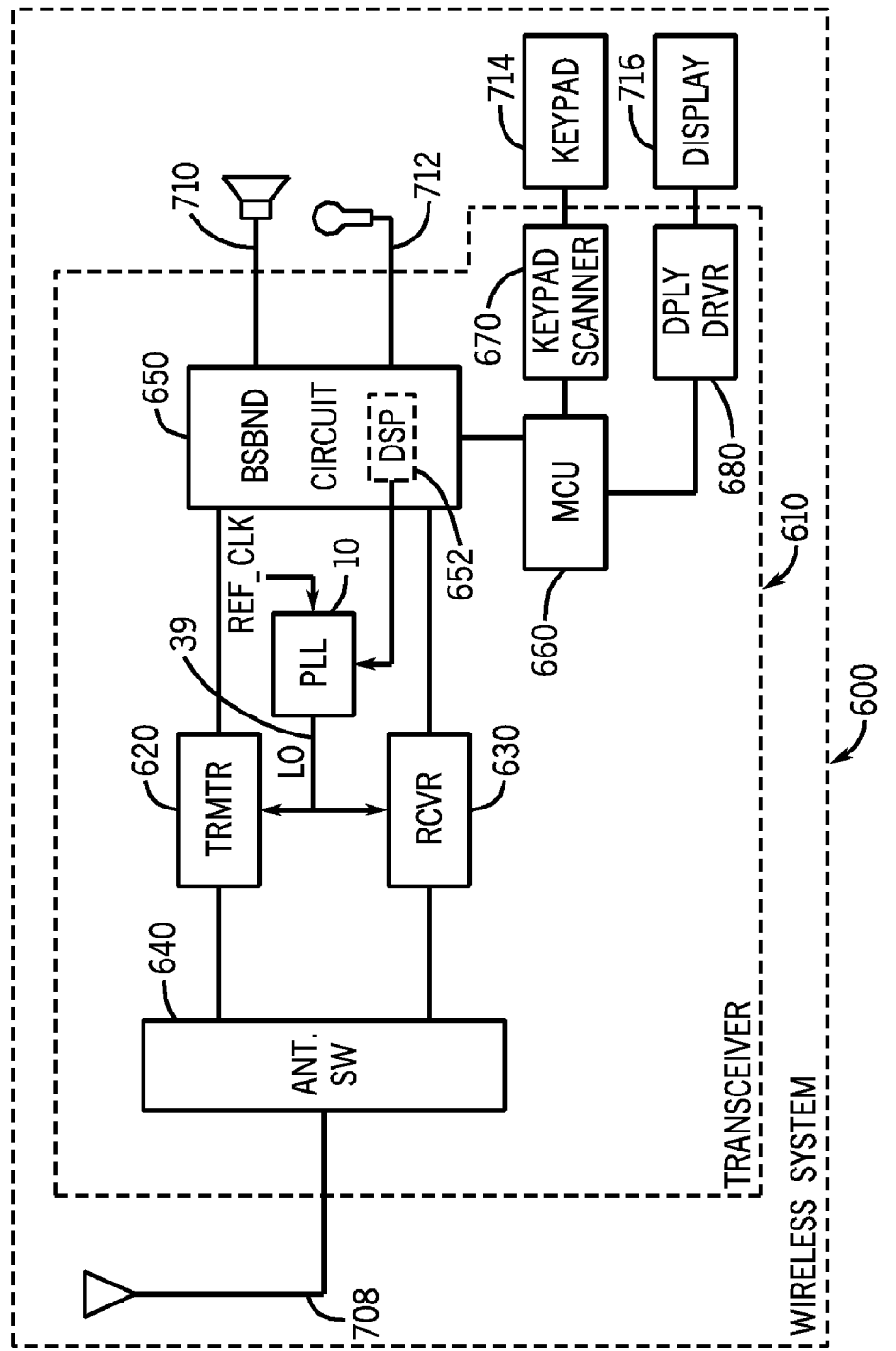
FIG. 15 is a schematic diagram of a wireless system according to an embodiment of the invention.

Referring to FIG. 15, in accordance with some embodiments of the invention, the PLL 10 may be used as a synthesizer to provide the LO local oscillator signal to a mixer of a wireless system 600. In this regard, in accordance with some embodiments of the invention, the PLL 10 may be part of a transceiver 610 (of the wireless system 600) that provides the LO signal to, for example, a transmitter 620 and a receiver 630 of the transceiver 610. The transmitter 620 and/or the receiver 630 may, therefore, use the LO signal for purposes of translating frequencies. In accordance with some embodiments of the invention, PLL 10 may be controlled by a digital signal processor (DSP) 652 (part of a baseband circuit 650), which controls the $K_{VCO}$ frequency gain to maintain the same approximate $K_{VCO}$ frequency gain for each selected band.

The baseband circuit 650 may, for example, provide a baseband signal to the transmitter 620; and the transmitter 620 may translate the baseband signal into a radio frequency (RF) signal that is communicated through an antenna switch 640 for purposes of routing the RF signal to an antenna 708 for transmission. For receptions, an RF signal may be received by the antenna 708 routed through the antenna switch 640 and received by the receiver 630. The receiver 630 may, for example, translate the RF frequency of the received RF signal into a baseband signal that is provided to the baseband circuit 650.

Among the other features of the transceiver 610, in accordance with some embodiments of the invention, the transceiver 610 may include a microcontroller unit (MCU) 660 that is coupled to the baseband circuit 650 and other circuitry of the transceiver 610 for purposes of coordinating the overall activity of the transceiver 610. Furthermore, in accordance with some embodiments of the invention, the MCU 660 may coupled to a keypad scanner 670 and a display driver 680. The keypad scanner 670 may, for example, receive keypad signals from a keypad 714 of the wireless system 600; and the display driver 680 may, for example, generate signals to drive a display 716 of the wireless system 600. Additionally, in accordance with some embodiments of the invention, the baseband circuit 650 may produce an audio output signal to drive a speaker 710 of the wireless system 600; and the baseband circuit 650 may process an audio analog signal that is received from a microphone 710 of the wireless system 600.

Depending on the particular embodiment of the invention, the transceiver 610 may be fabricated on a single semiconductor die. Although, in other embodiments of the invention, the transceiver 610 may be fabricated on multiple dies. The one or more dies that form the transceiver 610 may be incorporated into a single semiconductor package in some embodiments of the invention. However, in other embodiments of the invention, the transceiver 610 may be formed from multiple semiconductor packages. Thus, many variations are possible and are within the scope of the appended claims.

As examples, the wireless system 600 may be, for example, a cellular telephone, a personal digital assistant (PDA), a notebook computer, etc. Thus, in accordance with some embodiments of the invention, the wireless system 600 may be a handheld or portable device. However, in other embodiments of the invention, the wireless system 600 may be a less portable device, such as a desktop computer, for example. Thus, many variations are possible and are within the scope of the appended claims.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A method comprising:
   selecting a first frequency band out of a plurality of frequency bands;
   providing a voltage controlled oscillator to generate mixing signals for the selected first frequency band and a selected second frequency band other than the first frequency band;
   adjusting a frequency gain of the voltage controlled oscillator based on the selected first frequency band;
   selecting the selected second frequency band out of the plurality of frequency bands; and
   adjusting the frequency gain of the voltage controlled oscillator based on the selected second frequency band,
   wherein the acts of adjusting the frequency gain of the voltage controlled oscillator based on the selected first frequency band and adjusting the frequency gain of the voltage controlled oscillator based on the selected second frequency band comprises:
      causing a range in which the frequency gain of the voltage controlled oscillator spans for the selected first and second frequency bands to be substantially smaller than a range over which the frequency gain would span for the selected first and second frequency bands if the frequency gain was not adjusted based on the selected first and second frequency bands.

2. The method of claim 1, further comprising:
   adjusting a second gain in a phase locked loop to compensate for the adjustment of the frequency gain.

3. The method of claim 2, wherein the second gain comprises a gain of a phase detector.

4. The method of claim 1, wherein the act of adjusting the frequency gain of the voltage controlled oscillator based on the selected first frequency band comprises:
   compensating a dependence of the frequency gain on an operating band of the system.

5. The method of claim 1, wherein the act of adjusting the frequency gain of the voltage controlled oscillator based on the selected first frequency band comprises regulating a bias point of a varactor based on the frequency gain.

6. The method of claim 1, wherein the act of adjusting the frequency gain of the voltage controlled oscillator based on the selected first frequency band comprises regulating a slope of a capacitance versus a control signal of the voltage controlled oscillator based on the frequency gain.

7. An apparatus, comprising:
   a phase locked loop; and
   a circuit to control the phase locked loop to select a first frequency band for an output signal and a second frequency band other than the first frequency band for the output signal,
   wherein the phase locked loop comprises:
      an oscillator to generate the output signal in response to a frequency control signal, the oscillator being adapted to adjust a frequency gain of the oscillator in response to selection of the first frequency band for the output signal and readjust the frequency gain of the oscillator in response to selection of the second frequency band for the output signal; and
      a phase detector to generate the frequency control signal in response to a comparison between an indication of a reference signal and an indication of the output signal, the phase detector being adapted to vary a second gain of the phase detector to compensate for the adjustment and readjustment of the frequency gain,
   wherein a range in which the frequency gain of the controlled oscillator spans for the first and second frequency bands is substantially smaller than a range over which the frequency gain would span for the first and second frequency bands if the frequency gain was not adjusted and readjusted by the oscillator based on the selected first and second frequency bands.

8. The apparatus of claim 7, wherein the oscillator comprises at least one varactor, and the oscillator is adapted to adjust and readjust the frequency gain by adjusting a bias point of said at least one varactor.

9. The apparatus of claim 7, wherein the oscillator is adapted to regulate a slope of a capacitance versus a control signal of the voltage controlled oscillator based on the frequency gain.

10. The apparatus of claim 7, wherein the selected frequency band comprises a frequency band selected from the following:
    a AGSM band, a EGSM band, a DCS band and a PCS band.

11. The apparatus of claim 7, further comprising:
    a tuner to receive a mixing signal to tune within the first or selected frequency band,
    wherein the apparatus comprises a wireless system.

12. The apparatus of claim 11, wherein the local oscillator circuit comprises at least one varactor, and the local oscillator circuit is adapted to adjust the frequency gain by adjusting a bias point of said at least one varactor.

13. The apparatus of claim 11, wherein the local oscillator circuit is adapted to regulate a slope of a capacitance versus a control signal of the voltage controlled oscillator based on the frequency gain.

* * * * *